United States Patent [19]

Lindmayer

[11] 3,907,595

[45] Sept. 23, 1975

[54] SOLAR CELLS WITH INCORPORATE METAL LEYER

[75] Inventor: Joseph Lindmayer, Bethesda, Md.

[73] Assignee: Communications Satellite Corporation (COMSAT), Washington, D.C.

[22] Filed: Dec. 3, 1971

[21] Appl. No.: 204,467

[52] U.S. Cl. .................... 136/89; 29/572; 148/175; 317/235 UA

[51] Int. Cl. .................... H01l 15/02

[58] Field of Search .................... 136/89; 148/175; 317/235(31), 235(65); 13/89; 29/572

[56] References Cited

UNITED STATES PATENTS

| | | | |
|---|---|---|---|
| 2,938,938 | 5/1960 | Dickson, Jr. | 136/89 |
| 2,949,498 | 8/1960 | Jackson | 136/89 |
| 2,981,777 | 4/1967 | Reynolds | 136/89 |
| 2,995,473 | 8/1961 | Levi | 136/89 UX |
| 3,104,188 | 9/1963 | Moncrieff-Yeates | 136/89 |
| 3,290,175 | 12/1966 | Cusano et al. | 136/89 |
| 3,375,418 | 3/1968 | Garnache et al. | 317/235 UA |
| 3,480,473 | 11/1969 | Tanos | 136/89 X |
| 3,611,067 | 10/1971 | Oberlin et al. | 317/235(31) UX |
| 3,615,855 | 10/1971 | Smith | 136/89 |
| 3,623,925 | 11/1971 | Jenkins et al. | 317/235(31) UX |
| 3,642,526 | 2/1972 | Itoh et al. | 317/235 UA |

OTHER PUBLICATIONS

W. R. Cherry, "Photovaltaic Conversion," in 14th Annual Power Sources Conference, TJ/153/P6, pp. 37–42, 10/1960.

Iles, "Increased Output from Silicon Solar Cells," from Conf. Record of the 8th IEEE Photovaltaic Specialists Conf., 4–6, Aug. 1970, pp. 345–351.

*Primary Examiner*—Allen B. Curtis
*Attorney, Agent, or Firm*—Sughrue, Rothwell, Mion, Zinn & Macpeak

[57] ABSTRACT

The efficiency of a solar cell is improved by incorporating a metal layer beneath the P-N junction of the solar cell. The metal layer reflects back towards the junction light which would otherwise penetrate too deeply to contribute to the voltage and current output. The metal also produces charge carriers which are photo excited up to the conduction band of the semiconductor by light having photon energy less than the semiconductor band gap. The metal and the semiconductor material forming the solar cell are both highly ordered, thereby forming a barrier contact at the metal-semiconductor interface.

21 Claims, 2 Drawing Figures

SOLAR CELLS WITH INCORPORATE METAL LEYER

BACKGROUND OF THE INVENTION

The invention is in the field of solar cells and in particular is an improved semiconductor solar cell having a metal layer incorporated therein.

The technology of solar cells, particularly silicon solar cells, is fairly well developed and, for example, in the case of silicon solar cells, it is generally believed that the maximum practical solar conversion efficiency has been achieved. The present solar conversion efficiency is fairly low, and one of the reasons for this is that solar radiation is rich in infrared light, most of which does not contribute to the voltage or current output of the solar cell. The longer wavelengths of infrared light have a photon energy which is less than the band gap of the semiconductor solar cell and consequently these wavelengths are not capable of photo exciting hole-electron pairs into the conduction and valence bands of the semiconductor material. Other, relatively shorter wavelength, infrared light has sufficient photon energy to photo excite the hole-electron pairs, but due to the absorption characteristics of the semiconductor material and the relative close proximity of the P-N junction to the exposed surface of a semiconductor cell, these infrared wavelengths penetrate deeply into the semiconductor material and create hole-electron pairs sufficiently far removed from the junction to greatly increase the probability of hole-electron recombination prior to the charge carriers reaching the junction.

SUMMARY OF THE INVENTION

The efficiency of a semiconductor solar cell is improved by incorporating therein a thin metallic layer positioned beneath the P-N junction in the semiconductor. The metallic layer reflects long wavelength light thereby effectively giving that light a second pass at the junction. Additionally, light having insufficient photon energy to photo excite hole-electron pairs in a semiconductor material may have sufficient energy to cause photo emmission of charge carriers from the metal into the semiconductor. Both the metal layer and the semiconductor material are highly ordered, i.e., nearly crystalline, thereby resulting in a barrier contact at the metal-semiconductor interface. The barrier is in a direction to facilitate the flow of carriers from the metal to the semiconductor. The metal layer is preferably between 50 and 300A thick and is positioned about 5 to 50 microns from the exposed surface of the semiconductor; the exact position depending on the actual needs. For example, when the solar cell is used in space, it is preferable to have the metal layer close to the surface because of the presence of radiation and the known effects which radiation has on the semiconductor material.

DETAILED DESCRIPTION OF THE INVENTION

Figure 1:
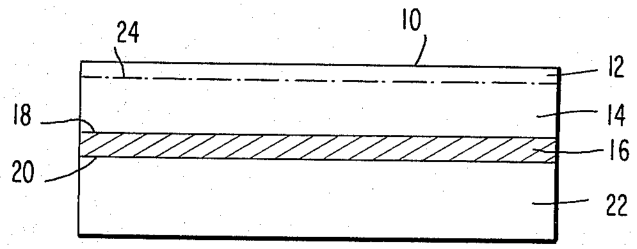
FIG. 1 is a cross sectional side view of a semiconductor solar cell in accordance with the subject invention.

In FIG. 1 there is shown an exaggerrated side view of a solar cell of the present invention. The solar cell comprises a semiconductor material having a P-N junction 24 near the surface 10 and formed between the regions 12 and 14 of the semiconductor material. The junction 24 may be a homo-junction, such as is found in silicon solar cells, or a hetero-junction as may be found in other types of solar cells. The portion 14 of the solar cell, hereinafter referred to as the bulk semiconductor is in contact at its lower face with thin metallic layer 16. The metallic layer 16 forms a barrier interface with bulk semiconductor 14. A substrate 22 may also be a semiconductive material forming a barrier interface 20 with metal 16. Although not illustrated in the drawings, the solar cell assembly is completed by adding electrodes to the upper and lower surfaces and optical coatings to minimize reflection from the solar cell, all of which may be accomplished in accordance with standard techniques in the solar cell art. In an alternate embodiment, the semiconductor layer 22, hereinafter referred to as the semiconductor substrate, may be dispensed with and the metal layer 16 may be used as the bottom electrode.

Figure 2:
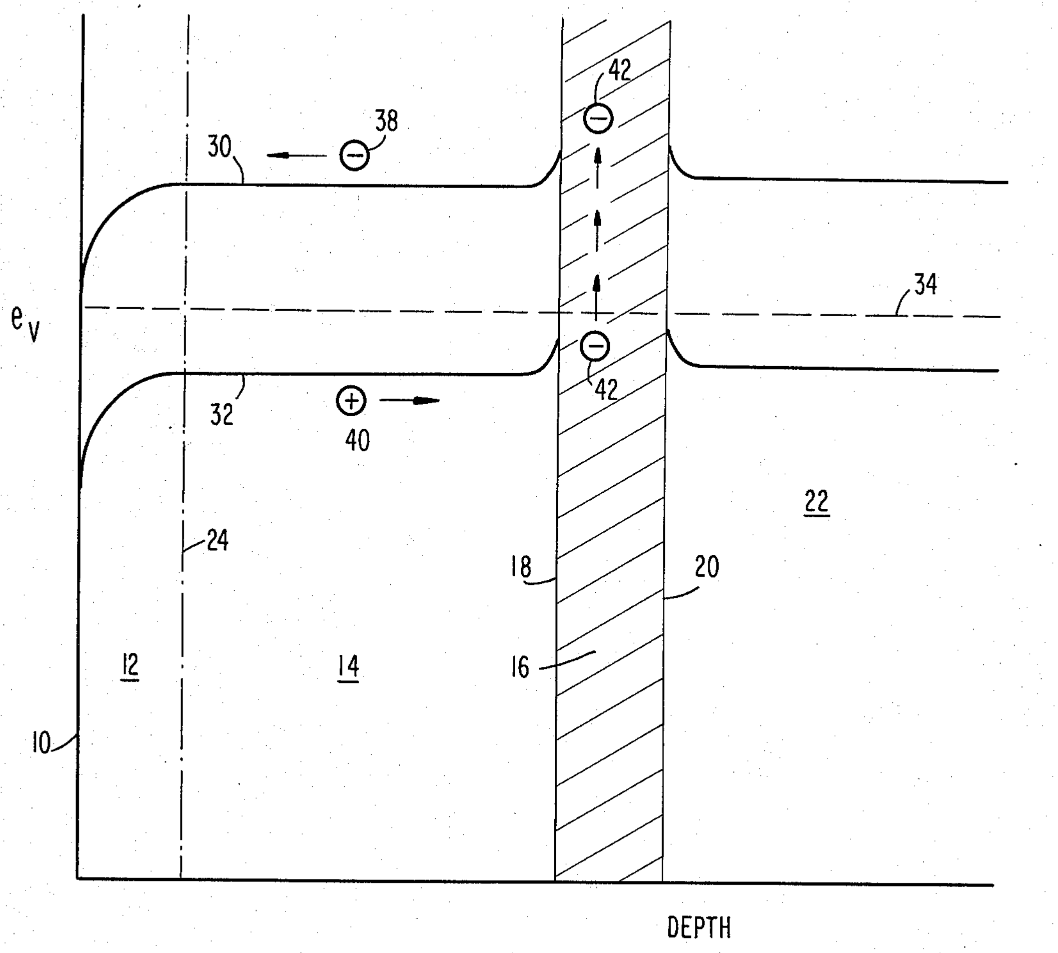
FIG. 2 is an energy band diagram of the solar cell shown in FIG. 1.

In order to understand the invention and in particular to understand the characteristics of the materials which may be combined to form an improved solar cell in accordance with the present invention, reference is made to the energy diagram illustrated in FIG. 2. Since the figure is a plot of energy versus depth in the device from the surface 10, the same numerals used in FIG. 1 to reference parts of the device are also used in FIG. 2. Thus, for example, broken line 24 represents the P-N junction in the semiconductor material, 18 represents the metal-bulk semiconductor interface, 20 represents the metal substrate semiconductor interface, and 12, 14 and 22 represent the semiconductor regions. The conduction band is represented by 30, the valence band by 32 and the Fermi level by 34. For the semiconductor material to be suitable for operation as a solar cell, the band gap (energy difference between valence and conduction bands) is preferably from 1–2 eV.

In the absence of the metal layer 16, the device would be the same as a standard semiconductor solar cell. That is, it would have the characteristic that photons of light having energy equal to or greater than the semiconductor band gap create electron-hole pairs which cause the photo-current and photo-voltage to occur. An electron 38 and hole 40 representing a single electron-hole pair created by a photon of light having energy equal to or greater than the band gap is illustrated. As is well known, and as is commonly described to illustrate the movement of the carriers, the electrons move or fall down the energy level whereas the holes moves up the energy level. The arrows adjacent electron 38 and hole 40 indicate the respective directions of movement. Considering only electron movement (hole movement is essentially opposite), photo-current is created provided the electron 38 moves across junction 24 to the surface electrodes without recombining with holes.

It is well known that in semiconductor solar cells long wavelength light e.g. some of the infrared region, does not contribute to photo-current but is lost in so far as the function of the solar cell is concerned. In fact, the light has the deleterious effect of unwanted heating of the solar cell.

The ineffective long wavelength light may be divided into two categories for the purpose of explaining the ineffectiveness. The first category comprises wavelengths above that which have sufficient energy to create electron-hole pairs, i.e. the first category includes the longer wavelength infrared which does not have sufficient photon energy to create electron-hole pairs in the semiconductor material. The second category comprises shorter wavelength infrared radiation which does have sufficient photon energy to create the hole electron-pairs necessary for the photo-current. However, in this second category, the light wavelengths are sufficiently long so that they penetrate deeply into the semiconductor material creating the hole-electron pairs relatively far removed from the P-N junction. The carriers created thereby are typically captured or recombined prior to reaching the junction and consequently do not contribute to photo-current or photovoltage. This is especially the case after a solar cell has been subjected to irradiation by x-ray electrons or protons. The latter radiation introduces defects into the crystal structure of the semiconductor, which defects have the effect of reducing the lifetime of minority carriers and thereby increasing the likelihood of recombination before the carriers cross the junction.

The incorporation of the metal layer 16 will improve the solar cell efficiency because of two different physical properties of the metal in the particular combination. First, the metal acts as a reflector to the light waves which have penetrated deep enough to reach the interface 18. The reflected light waves will, in essence, have a second pass at the junction, and for those wavelengths which are "deep-penetrating" but have photon energy equal to or greater than the band gap of the solar cell, electron hole pairs will be created at positions nearer junction 24 than would be the case in the absence of the reflecting metal 16. Secondly, some of the light which penetrates into the metal 16 will induce photo electric emmission from the metal into the semiconductor, i.e., the photons of light penetrating into the metal will excite electrons out of the metal into the semiconductor. It will be noted that a metal has free electrons in all energy levels up to the Fermi level, and, consequently, the photon energy needed to raise an electron in the metal up to the energy level of the conduction band 30 is less than that required to create electron-hole pairs in the semiconductor material.

The purpose of the metal layer is to increase the total concentration of charge carriers crossing the P-N junction and increase the photovoltages per given amount of incident solar radiation. The preferred characteristics of metal layers and the relation of the characteristics to the above purpose will now be described.

The metal-bulk semiconductor interface 18 must form a barrier contact preferably with few interface states, rather than an ohmic contact. A barrier contact is represented in an energy diagram by a bend in the valence and conduction bands. It is well known that an ohmic contact or a contact with a high density of interface states has the property of increasing electron-hole recombination and thus such a contact would provide an opposite result to that desired. On the other hand, a barrier contact does not have high surface recombination properties. In order to form a barrier contact or barrier interface between the metal and semiconductor materials, both should be highly ordered, i.e., nearly crystalline. [It should be noted that the phase "highly ordered" has a well established meaning in the semiconductor art.] The nearly crystalline condition can be achieved by epitaxially growing the semiconductor and the metal, both by known techniques, one on top of the other. Where a semiconductor substrate is used, a new surface on the semiconductor substrate may be grown epitaxially, followed by the epitaxial growth of the metal layer on top of the semiconductor substrate, followed in turn by the epitaxial growth of the bulk semiconductor on top of the metal layer. On the other hand, if a semiconductor substrate is not used, the bulk semiconductor may be epitaxially grown first, and the metal layer epitaxially grown on a surface of the bulk semiconductor. The formation of the P-N junction, which as previously stated may be a hetero-junction or a homo-junction, is independent of the formation of the metal semiconductor interface and may be accomplished by known techniques.

Another characteristic of the metal layer 16 is that it should induce bulk type carriers in the semiconductor at the metal semiconductor interface. What this means, for example, is that if the bulk region of the semiconductor is P-type, the metal semiconductor interface should induce the bulk to be further P-type in the region of the interface. This can be better understood by reference to the graph of FIG. 2 wherein it is assumed that the P-N junction 24 is formed by making region 12 N-type and region 14 P-type. Thus, the bulk semiconductor is P-type and the metal should be one which induces further P-type charge concentration in the region of the interface 18. If the metal induces P-type charge carriers as suggested, the conduction band will be bent up near the interface as illustrated. Consequently, electrons excited to energy levels above the conduction band by photons of light penetrating the metal 16 will be able to "fall down" the conduction band energy level towards the junction 24. On the other hand, if the metal semiconductor interface 18 induced opposite type conductivity in the bulk semiconductor, the conduction and valence bands would curve downward in the region of the interface 18. Consequently, there would be substantially no electrons excited from the metal into the semiconductor because of the inability of the electrons to travel "up" the energy band. Although it is not possible to predict with sufficient accuracy whether any given metal, when epitaxially deposited, will result in a "bending up" or a "bending down" of the conduction and valence bands, this can be determined experimentally by epitaxially growing the metal in question on an epitaxial semiconductor layer and observing, in a known manner, whether the energy bands bend up or bend down.

As an example, the process has been carried out according to the following procedure: a semiconductor substrate was epitaxially grown in a vapor deposition system in accordance with conventional techniques. Then, molybdenum was deposited in the same vapor deposition system by decomposition of molybdenum chlorides such as $MoCl_5$ or $MoO_2Cl_2$. The molybdenum chlorides decompose at low temperature and elemental molybdenum becomes available. The molybdenum was deposited for about two minutes at temperatures of approximately 800° to 1000° centigrade resulting in a metal layer of approximately 100 angstroms. Following this, the system was returned to the epitaxial growth of silicon, to form a P-type semiconductor bulk. During the process the molybdenum layer changes to molybdenum disilicide which is highly conductive and metallic. In this case, the metal bulk semiconductor interface did induce further bulk type conductivity in the semiconductor near the interface.

Another necessary characteristic of the metal utilized in the process is that it must be a high temperature metal which doesn't readily react with other compounds. Refractory metals, e.g., chromium, titanium, and molybdenum, should be suitable. On the other hand, common metals such as gold or aluminum would not be suitable because the temperature required to vapor deposit the metals are above the eutectic temperature of the metal semiconductor. This would result in undesired interaction in the semiconductor material.

The thickness of the metallic layer 16 should be somewhere between 50 and 300 angstroms, although the upper limit is not quite as critical as the lower limit. A layer thinner than 50 angstroms would probably be useless in that the light would pass right through it without being reflected or absorbed. On the other hand, if the layer is too thick, the photo-excited electrons in the metal will have a relatively long distance to travel before reaching the metal-bulk semiconductor interface and will lose their energy and therefore never be excited into the conduction band of the semiconductor. However, an overly thick metal layer will not have any deleterious effect on the reflection function. That is, it will still serve the purpose of reflecting the long wavelength light back towards the junction. If the metal were of the optimum width as described above, it would be too thin to suitably serve as the back electrode of the solar cell because a slight scratch would remove the metal all the way down to the semiconductor interface. However, the metal could be made very thick compared to the atomic dimensions previously referred to and thereby serve as the back electrode. However, under such circumstances the second function mentioned above — excitation of electrons from the metal into the semiconductor — would be severely diminished.

Where the metal layer 16 is used as the back electrode, as described above, it is possible to fabricate a symmetrical solar cell. This could be accomplished by growing another bulk semiconductor layer on the back side of layer 16, which layer would be identical to the first bulk layer. A P-N junction could be formed in the second bulk layer. The resulting device, assuming the inclusion of conventional surface metalization and optical filters, would be two back-to-back symmetrical solar cells, both having metal layer 16 as a common back electrode. An external connection would be made to metal layer 16.

When a semiconductor substrate 22 is added, forming an interface 20 with the metal layer 16, it is preferable to have the energy bands at a slightly different level than those in the semiconductor material 14. As illustrated in FIG. 2 the energy bands in material 22 are slightly higher than those in 14. This enhances the likelihood that a photoexcited electron from the metal layer 16 will go into the bulk 14 rather than in the substrate 22. This desired function may be provided by using a semiconductor material for the substrate which has a higher band gap than the band gap of the bulk semiconductor material. With this added feature, the electrons excited from the metal layer 16 are blocked from entering the substrate semiconductor by the higher conduction band edge at interface 20. Consequently, more of the electrons enter the bulk semiconductor 14 from the metal layer 16.

The depth of the metal-bulk semiconductor interface 18 is preferably about 5 to 50 microns from the surface 10. As one example, the interface 18 may be positioned close enough to the P-N junction 24 so that it is near the depletion region of the P-N junction. This will have the effect of raising the band edges and thereby increasing the photo voltage. However, there will be some loss of photo-current because some of the infrared wavelengths which would otherwise create hole-electron pairs will be partially reflected back out of the surface 10 before creating any hole-electron pairs. On the other hand, the cell would not degrade as much under irradiation.

It should be noted that although the energy diagram in FIG. 2 represents the case where the metal layer is in contact with a P-type semiconductor material, the explanation above and the invention is applicable to the case in which the metal layer is in contact with an N-type semiconductor material. For the latter case all bending of the energy bands would be in the opposite direction to that illustrated.

What is claimed is:

1. An improved solar cell comprising a. a first epitaxial layer of highly ordered semiconductor material having an N-type region and a P-type region with the interface between the two regions forming a P-N junction, one of said regions extending to a top surface of said layer and the other said region extending to a bottom surface of said layer, said semiconductor material having an energy band gap in the range 1–2 eV:

b. a highly ordered epitaxial layer of material exhibiting metallic properties of light reflection and electric conductivity in contact with and forming a barrier interface with said semiconductor layer at said bottom surface thereof.

2. An improved solar cell as claimed in claim 1 wherein said layer of material exhibiting metallic properties has the characteristic of inducing charge carriers in said semiconductor layer near said interface of the same type as the conductivity type of the said region of semiconductor material forming said interface.

3. An improved solar cell as claimed in claim 2 wherein said layer of material exhibiting metallic properties is between 50A and 300A thick.

4. An improved solar cell as claimed in claim 2 wherein said layer of material exhibiting metallic properties is $5\mu$ to $50\mu$ from said top surface.

5. An improved solar cell as claimed in claim 4 wherein said layer of material exhibiting metallic properties is between 50A and 300A thick.

6. An improved solar cell as claimed in claim 2 further comprising a substrate layer of highly ordered semiconductor material forming a barrier contact with the surface of said layer of material exhibiting metallic properties which is opposite the surface forming an interface with the first layer of semiconductor material.

7. An improved solar cell as claimed in claim 6 wherein said layer of material having metallic characteristics is a compound of a refractory metal and the material forming said first semiconductor layer.

8. An improved solar cell as claimed in claim 7 wherein said layer of material exhibiting metallic properties is between 50A and 300A thick and is positioned between $5\mu$ to $50\mu$ from said top surface.

9. An improved solar cell as claimed in claim 1 further comprising a second layer of highly ordered semiconductor material having an N-type region and a P-type region with the interface between the two regions forming a P-N junction, one of said regions extending to a top surface of said layer and the other said region extending to a bottom surface of said layer, said semiconductor material having an energy band gap in the range 1–2 eV, said second layer forming, at its upper surface, a barrier interface with a surface of said layer exhibiting metallic properties, said latter surface being opposite to the barrier interface formed with said first layer.

10. An improved solar cell comprising a. a layer of highly ordered silicon doped to form a P-type and an N-type conductivity regions with a P-N junction therebetween, said N-type region extending to an upper surface of said layer and said P-type region extending to a lower surface of said layer, b. a highly ordered layer of refractory metal-silicide forming a barrier contact with the lower surface of said silicon layer.

11. An improved solar cell as claimed in claim 10 wherein said refractory metal-silicide is molybdenum or its silicides.

12. An improved solar cell as claimed in claim 11 further comprising a highly ordered silicon substrate forming a barrier contact with said molybdenum disilicide layer on the opposite side from said silicon layer.

13. An improved solar cell as claimed in claim 12 wherein said molybdenum disilicide layer is between 50A and 300A thick.

14. An improved solar cell as claimed in claim 13 wherein said molybdenum disilicide layer is located from $5\mu$ to $50\mu$ from said upper surface.

15. The method of fabricating an improved solar cell comprising the steps of a. epitaxially growing, by vapor deposition, a highly ordered substrate layer, b. epitaxially growing, by vapor deposition of a refractory metal, a highly ordered metallic layer on said substrate layer c. epitaxially growing, by vapor deposition, a highly ordered layer of semiconductor material on said metal layer, and d. forming a P-N junction in said semiconductor layer.

16. The method of fabricating an improved solar cell as claimed in claim 15 wherein the step of epitaxially growing a metallic layer comprises vapor depositing said refractory metal at a temperature and for a period of time sufficient to grow said metal layer to a thickness of between 50A and 300A.

17. The method of fabricating an improved solar cell as claimed in claim 15 wherein the step of epitaxially growing a highly ordered layer of semiconductor material comprises vapor depositing said semiconductor layer at sufficient temperature and for sufficient time to grow said layer to a thickness of between $5\mu$ and $50\mu$.

18. The method as claimed in claim 15 wherein said semiconductor layer is a layer of silicon having a P-type and an N-type conductivity regions.

19. The method as claimed in claim 18 wherein the step of epitaxially growing a metallic layer comprises vapor depositing molybdenum from a chloride of molybdenum on said substrate.

20. The method as claimed in claim 19 wherein the step of vapor depositing molybdenum is carried out at a temperature of approximately 800°C to 1000°C for about two minutes.

21. The method as claimed in claim 18 wherein said substrate is a layer of highly ordered silicon.

* * * * *